(12) United States Patent
Uchino et al.

(10) Patent No.: US 11,266,040 B2
(45) Date of Patent: Mar. 1, 2022

(54) HEAT TRANSPORT DEVICE

(71) Applicant: LENOVO (SINGAPORE) PTE. LTD., Singapore (SG)

(72) Inventors: Akinori Uchino, Kanagawa (JP); Takuroh Kamimura, Kanagawa (JP); Atsushi Ohyama, Kanagawa (JP); Ryota Watanabe, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/863,525

(22) Filed: Apr. 30, 2020

(65) Prior Publication Data
US 2020/0359530 A1 Nov. 12, 2020

(30) Foreign Application Priority Data
May 9, 2019 (JP) .............................. JP2019-89251

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01); *G06F 2200/201* (2013.01)

(58) Field of Classification Search
CPC ............... H05K 7/20336; H05K 7/208; H05K 7/20809; H05K 7/20881; H05K 7/20936; H05K 7/20809; G06F 1/203; G06F 2200/201; G06F 1/20; F28D 15/02–06; H01L 23/473
See application file for complete search history.

(56) References Cited

U.S. PATENT DOCUMENTS

| | | | | |
|---|---|---|---|---|
| 6,122,167 A * | 9/2000 | Smith | ..................... | G06F 1/182 257/E23.088 |
| 6,304,441 B1 * | 10/2001 | Han | ........................ | G06F 1/203 361/679.48 |
| 6,408,934 B1 * | 6/2002 | Ishida | ................. | F28D 15/0233 165/104.33 |
| 6,751,095 B2 * | 6/2004 | Ishikawa | ............... | F28D 1/0308 361/679.21 |

(Continued)

FOREIGN PATENT DOCUMENTS

| JP | 2000101006 A | 4/2000 |
|---|---|---|
| JP | 2000349479 A | 12/2000 |

(Continued)

*Primary Examiner* — Michael A Matey
(74) *Attorney, Agent, or Firm* — Antony P. Ng; Russell Ng PLLC (57) ABSTRACT

A heat transport device is disclosed. The heat transport device includes a heat pipe and a heat spreader. The heat pipe, which is thermally connecting to a heating element, includes a heat receiving surface for receiving heat from the heating element, and a side surface intersecting with the heat receiving surface. The heat spreader, which is thermally connecting to the heat pipe, includes a first plate member having a first side surface thermally connecting to the side surface of the heat pipe, and a second plate member having a side surface thermally connecting to a second side surface of the first plate member opposite to the first side surface in contact with the heat pipe.

11 Claims, 8 Drawing Sheets

(56) References Cited

U.S. PATENT DOCUMENTS

| | | | | |
|---|---|---|---|---|
| 6,819,559 | B1* | 11/2004 | Seeger | G06F 1/203 |
| | | | | 126/684 |
| 7,697,288 | B2* | 4/2010 | Okutsu | G06F 1/203 |
| | | | | 361/695 |
| 8,746,325 | B2* | 6/2014 | Huang | F28D 15/0275 |
| | | | | 165/80.2 |
| 8,806,748 | B2* | 8/2014 | Huang | F28D 15/0275 |
| | | | | 29/890.032 |
| 9,405,335 | B1* | 8/2016 | Bollard | B23P 15/26 |
| 9,578,791 | B1* | 2/2017 | Shen | H05K 7/20954 |
| 9,976,813 | B2* | 5/2018 | Yu | F28D 15/0275 |
| 10,546,799 | B2* | 1/2020 | Uchino | G06F 1/1662 |
| 2004/0080908 | A1* | 4/2004 | Wang | G06F 1/203 |
| | | | | 361/679.47 |
| 2005/0201061 | A1* | 9/2005 | Nikfar | F28D 15/0275 |
| | | | | 361/700 |
| 2007/0075412 | A1* | 4/2007 | Reid | H05K 1/021 |
| | | | | 257/686 |
| 2007/0236887 | A1* | 10/2007 | Cheng | H01L 23/427 |
| | | | | 361/700 |
| 2008/0130221 | A1* | 6/2008 | Varadarajan | G06F 1/203 |
| | | | | 361/679.52 |
| 2008/0247136 | A1* | 10/2008 | Peng | G06F 1/20 |
| | | | | 361/697 |
| 2009/0080160 | A1* | 3/2009 | Wu | H01L 23/467 |
| | | | | 361/704 |
| 2009/0178787 | A1* | 7/2009 | Huang | H01L 23/427 |
| | | | | 165/104.33 |
| 2009/0223651 | A1* | 9/2009 | Meyer, IV | G06F 1/20 |
| | | | | 165/104.19 |
| 2010/0053885 | A1* | 3/2010 | Ali | G06F 1/203 |
| | | | | 361/679.54 |
| 2010/0122799 | A1* | 5/2010 | Lin | F28D 15/0233 |
| | | | | 165/104.26 |
| 2011/0030922 | A1* | 2/2011 | Chen | F28D 15/0275 |
| | | | | 165/104.26 |
| 2011/0214904 | A1* | 9/2011 | Ohsawa | H01L 23/3736 |
| | | | | 174/252 |
| 2012/0002370 | A1* | 1/2012 | Ohsawa | F28D 15/046 |
| | | | | 361/689 |
| 2012/0216991 | A1* | 8/2012 | Chen | F28D 15/0233 |
| | | | | 165/104.21 |
| 2012/0305221 | A1* | 12/2012 | Huang | F28D 15/0275 |
| | | | | 165/104.26 |
| 2012/0312508 | A1* | 12/2012 | Shen | F28D 15/0233 |
| | | | | 165/104.26 |
| 2012/0318480 | A1* | 12/2012 | Lin | F28D 15/0233 |
| | | | | 165/104.26 |
| 2013/0008630 | A1* | 1/2013 | Yuan | H01L 23/427 |
| | | | | 165/104.21 |
| 2013/0014917 | A1* | 1/2013 | Huang | H01L 21/4882 |
| | | | | 165/104.26 |
| 2013/0105123 | A1* | 5/2013 | Chen | H01L 23/36 |
| | | | | 165/104.26 |
| 2013/0120926 | A1* | 5/2013 | Barina | F28D 15/0275 |
| | | | | 361/679.32 |
| 2013/0155622 | A1* | 6/2013 | Chang | H05K 7/20809 |
| | | | | 361/720 |
| 2013/0294030 | A1* | 11/2013 | Wang | G06F 1/203 |
| | | | | 361/700 |
| 2014/0182817 | A1* | 7/2014 | Yu | H05K 7/20809 |
| | | | | 165/104.21 |
| 2015/0043148 | A1* | 2/2015 | Zhang | H05K 7/20727 |
| | | | | 361/679.32 |
| 2015/0048073 | A1* | 2/2015 | Chiu | H01L 23/427 |
| | | | | 219/209 |
| 2015/0192369 | A1* | 7/2015 | Rivera | G06F 1/20 |
| | | | | 165/104.19 |
| 2015/0216081 | A1* | 7/2015 | Huang | H05K 7/20336 |
| | | | | 165/104.21 |
| 2015/0285573 | A1* | 10/2015 | Stellman | G06F 1/20 |
| | | | | 361/679.54 |
| 2016/0282054 | A1* | 9/2016 | Hirasawa | H01L 23/3736 |
| 2016/0282914 | A1* | 9/2016 | Saito | F28D 15/0266 |
| 2017/0010642 | A1* | 1/2017 | Cheng | H05K 7/20336 |
| 2017/0055372 | A1* | 2/2017 | Ahamed | H05K 7/20336 |
| 2017/0277235 | A1* | 9/2017 | Delano | H05K 7/20336 |
| 2017/0295640 | A1* | 10/2017 | Tsunoda | H05K 9/0024 |
| 2019/0093957 | A1* | 3/2019 | Lin | H01L 23/427 |
| 2019/0098743 | A1* | 3/2019 | Molla | H01L 23/3736 |
| 2019/0104608 | A1* | 4/2019 | Laurent | H01L 23/40 |
| 2019/0204015 | A1* | 7/2019 | Huang | F28D 15/0233 |
| 2019/0254190 | A1* | 8/2019 | Shiau | H05K 7/205 |
| 2019/0364695 | A1* | 11/2019 | Lee | H05K 9/0024 |
| 2019/0380231 | A1* | 12/2019 | Nakata | H05K 9/0024 |
| 2020/0100389 | A1* | 3/2020 | Park | H05K 7/20336 |
| 2020/0337178 | A1* | 10/2020 | Paavola | G06F 1/203 |
| 2021/0007246 | A1* | 1/2021 | Watanabe | F28D 15/02 |
| 2021/0041926 | A1* | 2/2021 | Park | H04B 1/3827 |

FOREIGN PATENT DOCUMENTS

| | | |
|---|---|---|
| JP | 2001044347 A | 2/2001 |
| JP | 2004019990 A | 1/2004 |
| JP | 3208516 U | 1/2017 |

* cited by examiner

HEAT TRANSPORT DEVICE

PRIORITY CLAIM

The present application claims benefit of priority under 35 U.S.C. §§ 120, 365 to the previously filed Japanese Patent Application No. JP2019-89251 with a priority date of May 9, 2019, which is incorporated by reference herein.

TECHNICAL FIELD

The present invention relates to heat transport devices in general, and in particular to a heat transport device that transports heat from a heating element located within an electronic apparatus.

BACKGROUND

An electronic apparatus, such as a laptop personal computer (PC), may include a heating element, such as a central processing unit (CPU), and it is desirable to appropriately dissipate heat from the heating element. Because a CPU, a heat pipe, and a heat spreader are stacked in a thickness direction within a chassis of an electronic apparatus, it is difficult to make the electronic apparatus.

Figure 8A:
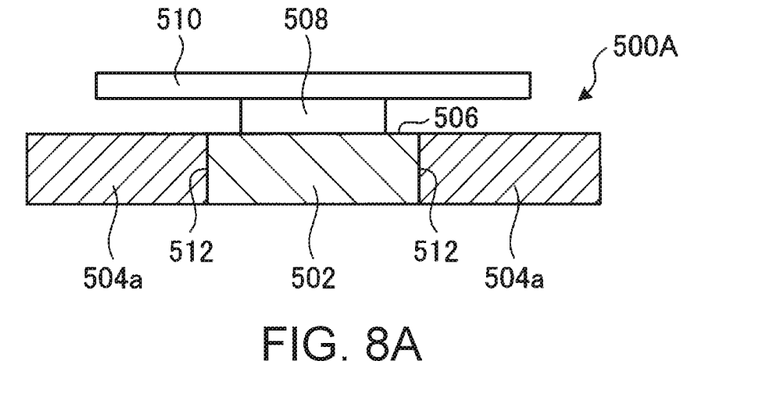
FIG. 8A is a sectional side view of the first example.

In addition, combinations of a heat pipe and a heat spreader include heat transport devices 500A, 500B, and 500C, as illustrated in FIG. 8. The heat transport device 500A illustrated in FIG. 8A includes a heat pipe 502 and a heat spreader 504a. The heat pipe 502 has a heat receiving surface 506 in contact with a CPU 508, which is a heating element. The CPU 508 is mounted on a board 510. The heat spreader 504a is fixed to a side surface 512 perpendicularly intersecting with the heat receiving surface 506 of the heat pipe 502 to perform heat transfer. The heat pipe 502 and the heat spreader 504a are equal in thickness. This heat transport device 500A is heavy in weight since the heat spreader 504a is thick. In addition, although a design area of contact between the heat pipe 502 and the heat spreader 504a is large, there is concern that no good heat transfer characteristics can be obtained if an actual contact between them is insufficient.

Figure 8B:
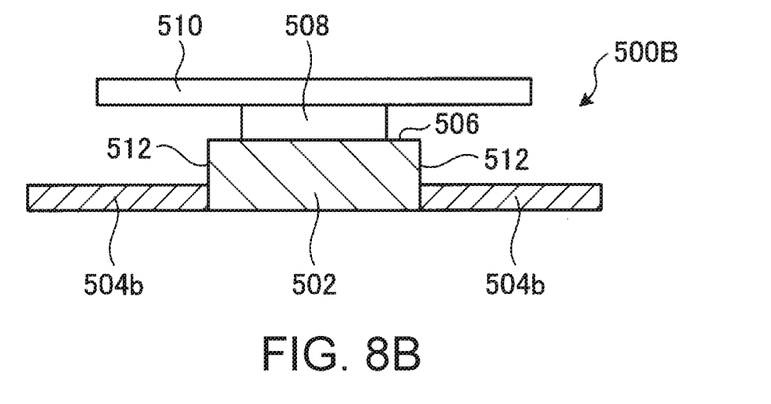
FIG. 8B is a sectional side view of the second example.

The heat transport device 500B illustrated in FIG. 8B includes the heat pipe 502 and a heat spreader 504b. The heat spreader 504b is fixed to the side surface 512 to perform heat transfer. The heat spreader 504b is thinner than the heat pipe 502. This heat transport device 500B is light in weight since the heat spreader 504b is thin. However, since an area of contact between the heat pipe 502 and the heat spreader 504b is small, there is concern that heat transfer characteristics and mechanical strength may be insufficient.

Figure 8C:
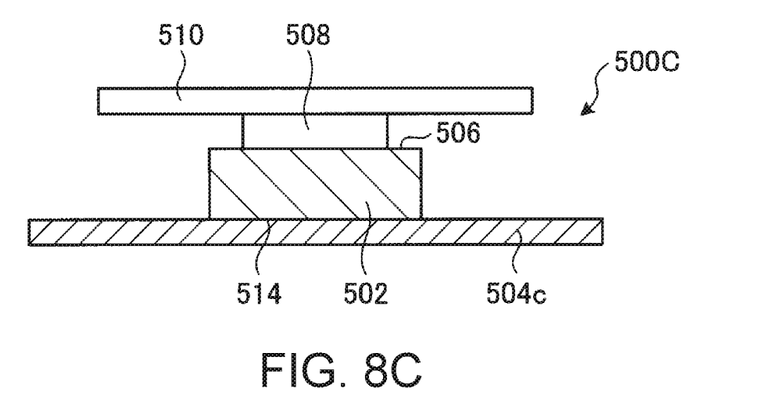
FIG. 8C is a sectional side view of the third example.

The heat transport device 500C illustrated in FIG. 8C includes the heat pipe 502 and a heat spreader 504c. The heat spreader 504c is fixed to an opposed surface 514 opposite to the heat receiving surface 506 of the heat pipe 502. In this heat transport device 500C, the CPU 508, the heat pipe 502, and the heat spreader 504c are stacked in a thickness direction. Although it is possible to set the heat spreader 504c moderately thin, it is desirable to make it thinner.

The present disclosure provides an improved heat transport device that transports heat of a heating element within an electronic apparatus.

SUMMARY

In accordance with an embodiment of the present disclosure, a heat transport device includes a heat pipe and a heat spreader. The heat pipe, which is thermally connecting to a heating element, includes a heat receiving surface for receiving heat from the heating element, and a side surface intersecting with the heat receiving surface. The heat spreader, which is thermally connecting to the heat pipe, includes a first plate member having a first side surface thermally connecting to the side surface of the heat pipe, and a second plate member having a side surface thermally connecting to a second side surface of the first plate member opposite to the first side surface in contact with the heat pipe.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
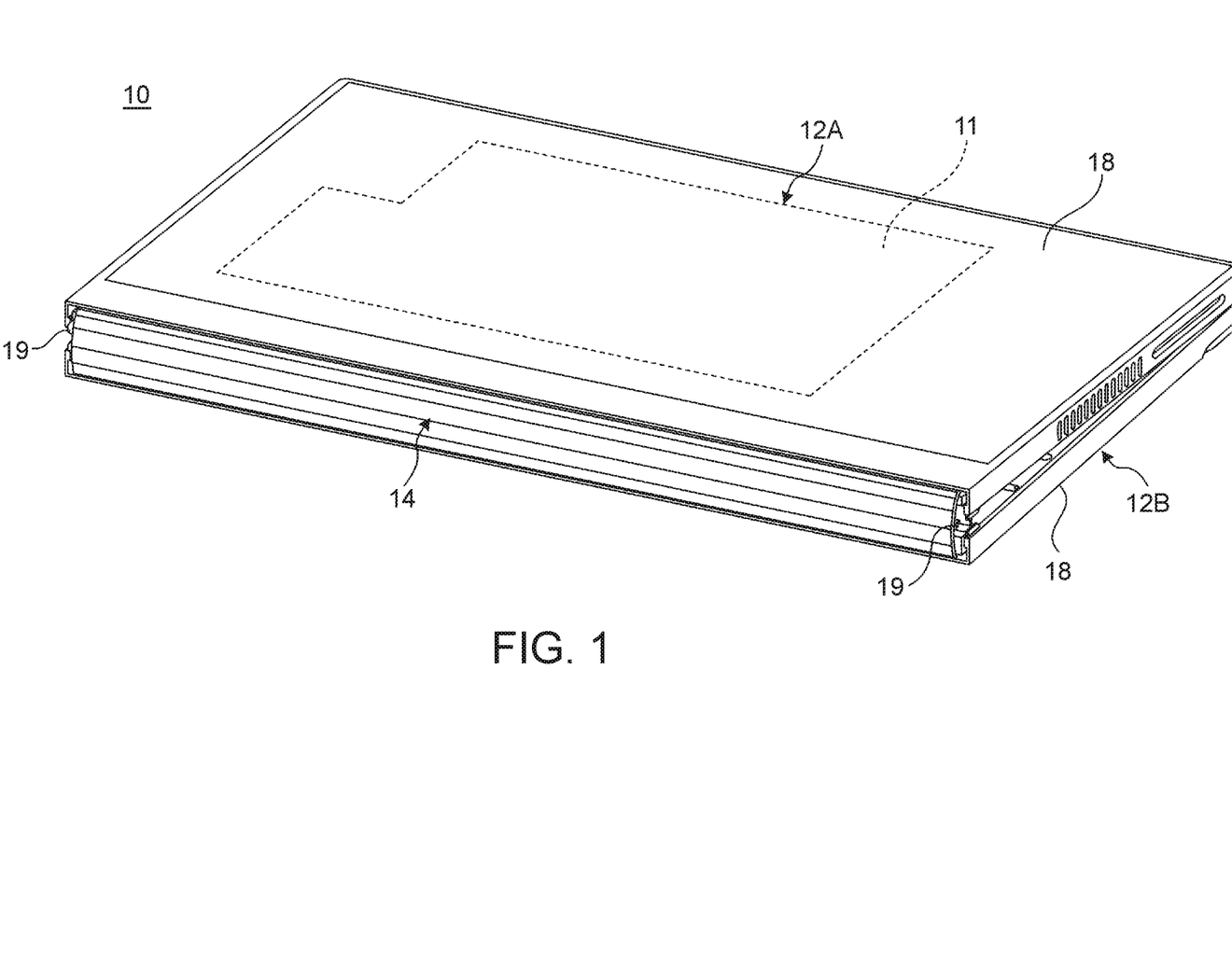
FIG. 1 is a perspective view illustrating a state in which an electronic apparatus is closed into a storage form.
Figure 2:
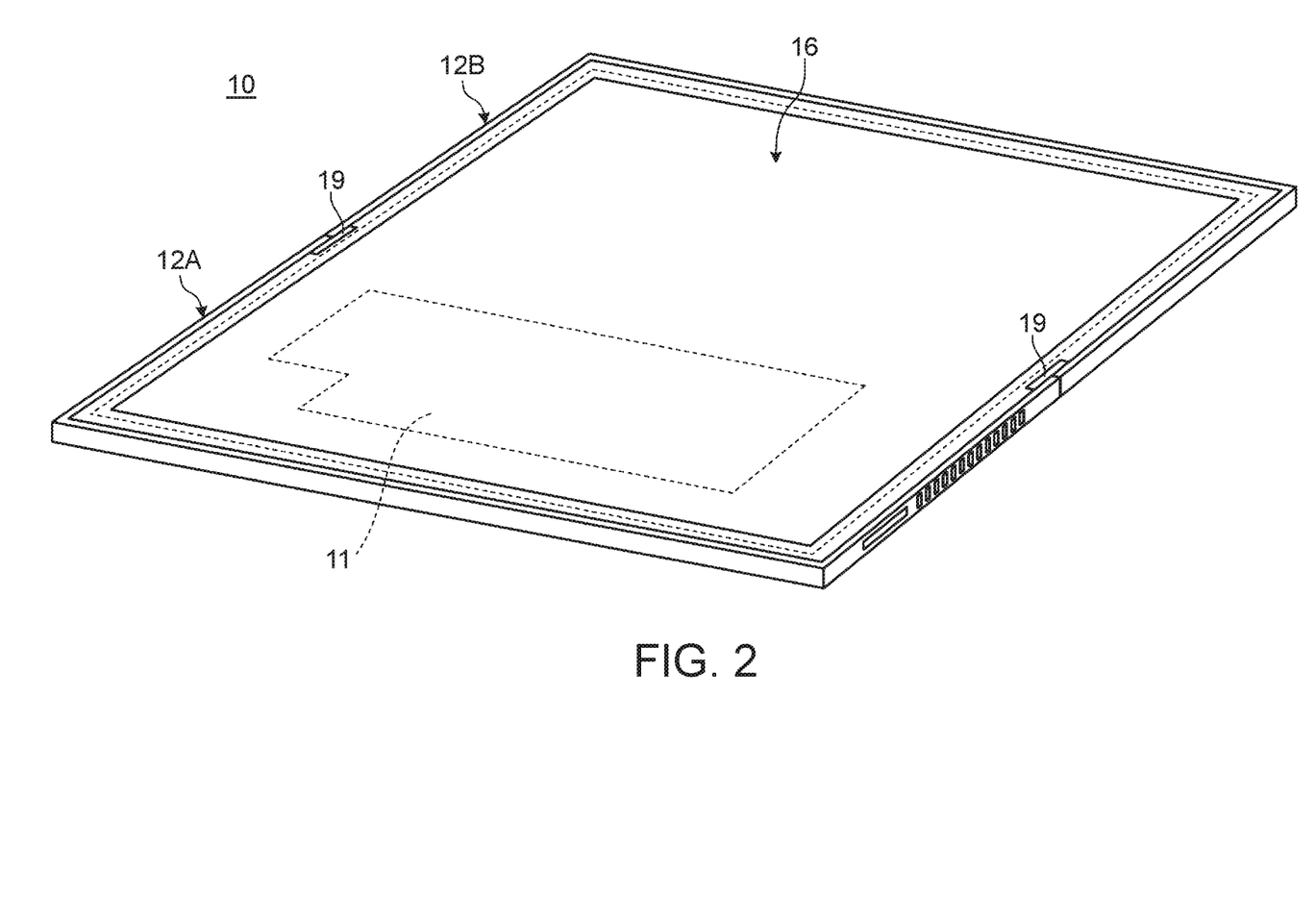
FIG. 2 is a perspective view illustrating a state in which the electronic apparatus illustrated in FIG. 1 is opened into a usage form.
Figure 3:
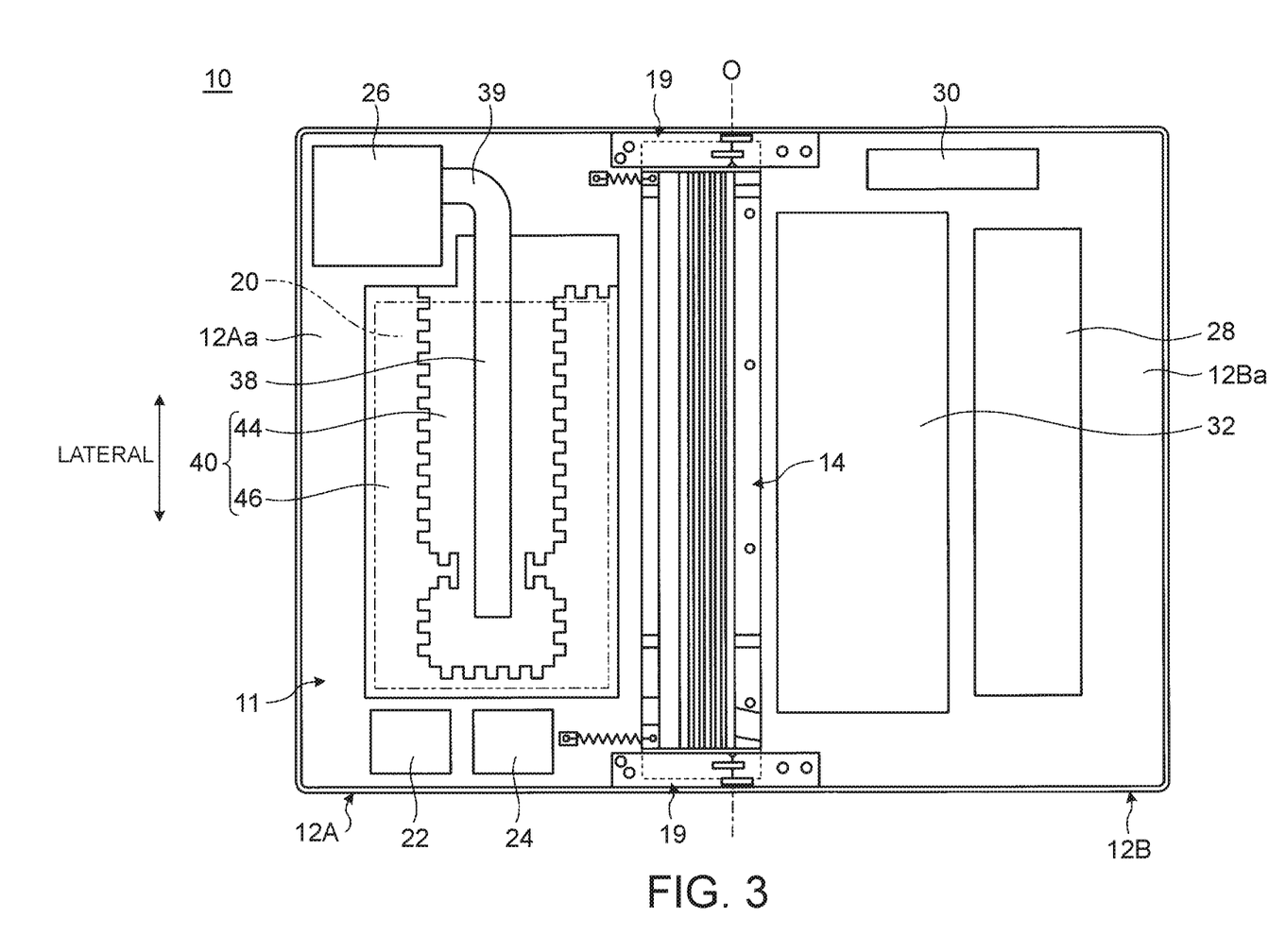
FIG. 3 is a plan view illustrating an internal structure of the electronic apparatus illustrated in FIG. 2.

FIG. 1 is a perspective view illustrating a state in which an electronic apparatus 10 is closed into a storage form. FIG. 2 is a perspective view schematically illustrating a state in which the electronic apparatus 10 illustrated in FIG. 1 is opened into a usage form. FIG. 3 is a plan view illustrating an internal structure of the electronic apparatus 10 illustrated in FIG. 2. The electronic apparatus 10 includes therein a heat transport device 11, according to one embodiment.

As illustrated in FIG. 1 and FIG. 2, the electronic apparatus 10 includes two chassis members 12A and 12B, a backbone member 14, and a display 16. The chassis members 12A and 12B are covered with a cover 18. The cover 18 is polyurethane, for example. In the present embodiment, a tablet personal computer (PC) foldable into a double-folded state like a book is illustrated as the electronic apparatus 10 by an example. The electronic apparatus 10 may be a mobile phone, a smart phone, or an electronic notebook etc.

The display 16 is a touch panel type liquid crystal display, for example. The display 16 is structured to be foldable together when the chassis members 12A and 12B are folded. The display 16 is a flexible display, such as an organic EL (Electro Luminescence), having a paper structure with high flexibility, for example, and is opened/closed with an opening/closing operation of the chassis members 12A and 12B.

The chassis members 12A and 12B are each rectangular plate-like members in which side walls are formed so as to be raised on three sides other than the side corresponding to the backbone member 14. The chassis members 12A and 12B each include metallic plates of stainless steel, magnesium, or aluminum etc., or fiber reinforced resin plates containing reinforced fibers, such as carbon fibers, and the like, for example. The display 16 is fixed to inner surface sides of the chassis members 12A and 12B through support plates. The chassis members 12A and 12B are joined through a pair of hinge mechanisms 19 and 19. The hinge mechanism 19 joins the chassis members 12A and 12B so as to be foldable into the storage form illustrated in FIG. 1 and the usage form illustrated in FIG. 2. A line O illustrated by a dashed-dotted line in FIG. 3 represents a folding center C serving as the center of folding operation of the chassis members 12A and 12B.

As illustrated in FIG. 3, the heat transport device 11, a rectangular main board 20, a communication module 22, and a Solid State Drive (SSD) 24 etc. are attached and fixed to an inner surface 12Aa of the chassis member 12A. The heat transport device 11 is disposed between the main board 20 and the inner surface 12Aa (refer to FIG. 4). It is to be noted that in FIG. 3, only an outline of the main board 20 closer to the viewer is indicated by a phantom line so that the heat transport device 11 is easily visibly recognized. The main board 20 and the heat transport device 11 cover a large area of the inner surface 12Aa of the chassis member 12A. A cooling fan 26 is provided in a corner of the chassis member 12A. A sub-board 28, an antenna 30, and a battery device 32 etc. are attached and fixed to an inner surface 12Ba of the chassis member 12B.

Figure 4:
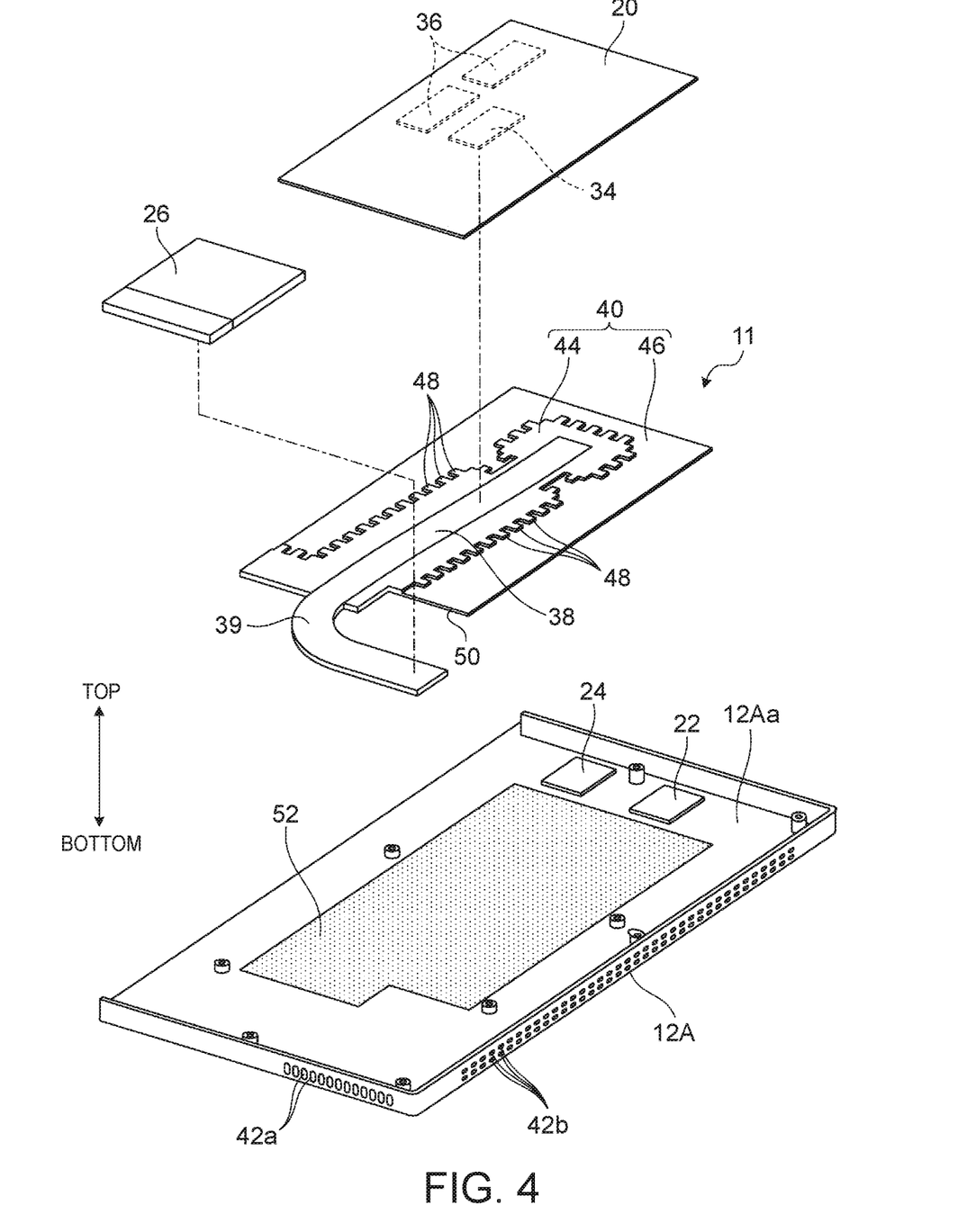
FIG. 4 is an exploded perspective view of a chassis member and elements provided therein.

FIG. 4 is an exploded perspective view of the chassis member 12A and elements provided therein. In the following description, a direction in which the main board 20 is disposed, is defined as top, and a direction in which the chassis member 12A is disposed, is defined as bottom, in FIG. 4.

As illustrated in FIG. 4, a central processing unit (CPU) 34, and a memory 36 etc. are mounted on a bottom surface of the main board 20. The CPU 34 is a heating element that generates the largest amount of heat of electronic components mounted in the electronic apparatus 10.

The heat transport device 11 is a component that transports heat of the CPU 34 to radiate it, and includes a heat pipe 38 thermally connecting to the CPU 34, and a heat spreader 40 thermally connecting to the heat pipe 38 to radiate it. The size of the heat transport device 11 is set to the same as or slightly larger than that of the main board 20 in planar view.

The heat pipe 38 is a heat transport device that has a configuration in which a metallic tube whose both ends are joined to form an enclosed space inside is crushed, and is able to highly efficiently transport heat by taking advantage of phase changes of hydraulic fluid enclosed in the enclosed space. The heat pipe 38 is disposed in such a manner to be partly in contact with the CPU 34, and an end part 39 is connected to a cooling fin, which is adjacent to a blast port of the cooling fan 26, in a heat-transferable manner. The cooling fan 26 is disposed in the vicinity of the end part 39, intakes air from either one of air holes 42a in one side surface and air holes 42b in another side surface of the chassis member 12A and exhausts the air to the other to release the heat of the heat pipe 38.

The heat spreader 40 has a first plate member 44 surrounding a part of the heat pipe 38 other than the end part 39 and fixed, and a second plate member 46 further surrounding substantially an entire periphery of the first plate member 44 and fixed. The heat pipe 38 and the first plate member 44 have the same thickness. The second plate member 46 is thinner than the first plate member 44. A side of the heat spreader 40 on a side where the end part 39 is disposed, is substantially formed of only the first plate member 44. The first plate member 44 can stably support the protruding end part 39 since it is thicker than the second plate member 46. The heat pipe 38, the first plate member 44, and the second plate member 46 extend along the inner surface 12Aa and do not overlap in the top and bottom direction. The first plate member 44 has an area equal to or larger than that of the heat pipe 38. The second plate member 46 has an area larger than that of the first plate member 44.

The heat pipe 38 and the first plate member 44 are fixed to each other by press or press-fitting, for example, and are in contact with each other. Press-fitting of the heat pipe 38 and the first plate member 44 can be performed by pressurizing a metallic tube and a base material of the first plate member 44 at the same time by rolling motion of a roller, crushing the metallic tube to form the heat pipe 38, while at the same time, press-fitting the first plate member 44 in a side surface of the heat pipe 38, for example.

The first plate member 44 and the second plate member 46 are fixed to each other by press or press-fitting, for example, and are in contact with each other. In the boundary between the first plate member 44 and the second plate member 46, comb-teeth like engaging portions 48 continuously provided over substantially the entire periphery of the border are formed. The area of contact between the first plate member 44 and the second plate member 46 becomes large due to mutual engagement of the engaging portions 48, which improves mechanical connection strength and heat conductivity. A notch 50 avoiding the cooling fan 26 is formed in a corner of the second plate member 46.

The heat spreader 40 is a high heat conductive metallic plate, and is aluminum, copper, stainless steel, or its alloy, for example. The first plate member 44 and the second plate member 46 may be made of the same material or different materials.

The heat pipe 38 is partly in contact with the CPU 34 and extends in both width-wise directions to transfer heat to the heat spreader 40 and the cooling fan 26. The heat spreader 40 has a sufficiently large area, and prevents the temperature of the CPU 34 from excessively rising, by receiving heat from the CPU 34 to radiate it. In addition, a cooling effect is further enhanced because the end part 39 of the heat pipe 38 receives wind from the cooling fan 26. However, the cooling fan 26 may be omitted according to thermal conditions. A heating element whose heat is transported by the heat transport device 11, is not limited to the CPU 34, but may be an SSD 24, the antenna 30, the memory 36, or a battery charger etc.

Substantially the entire surface of a part of the inner surface 12Aa of the chassis member 12A which part is in contact with the heat transport device 11, is coated with a metallic film (heat transfer material) 52. When the metallic film 52 is provided, in planar view, in a part including the boundary between the heat pipe 38 and the first plate member 44 or a part including the boundary between the first plate member 44 and the second plate member 46, of the parts that are in contact with the heat transport device 11, the heat conduction between these two members can be enhanced. In particular, if there is concern that the contact between these two members becomes insufficient for some reason (such as a manufacturing error or aging), or when the chassis member 12A is made of a low heat conductive material (such as a resin material), the heat conduction between the two members can preferably be complemented. The metallic film 52 can enhance heat conductivity if provided in at least a part of the part in contact with the heat transport device 11.

The metallic film 52 is a metallic material that has higher heat conductivity than the chassis member 12A, and is aluminum, or copper, for example. The metallic film 52 is formed on the inner surface 12Aa of the chassis member 12A by vapor deposition, adhesion of a metallic foil, or application of a metal-containing coating, and is sufficiently thin. In FIG. 4, the metallic film 52 is indicated by a dot pattern.

Figure 5:
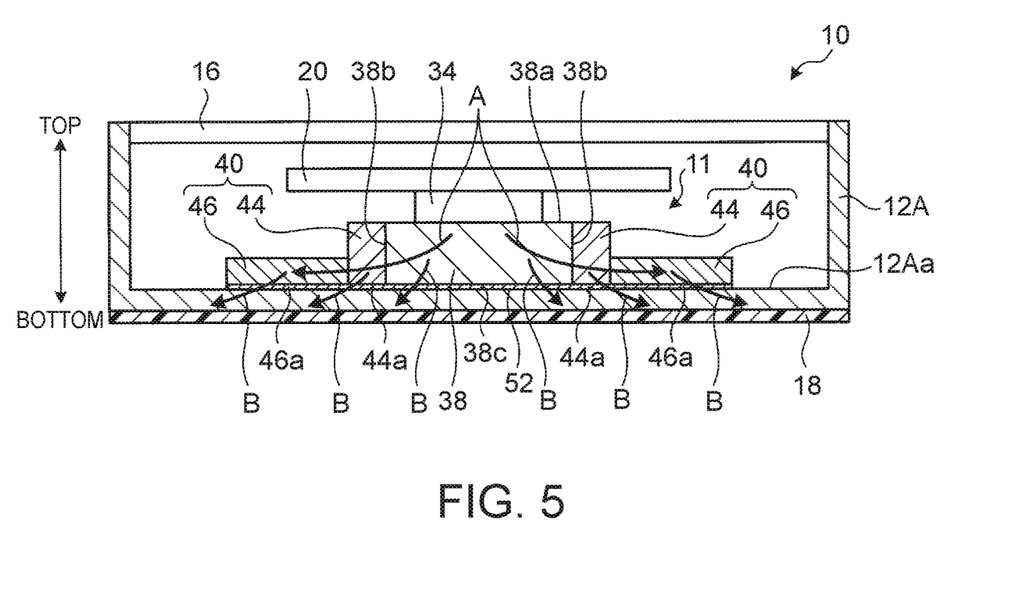
FIG. 5 is a sectional side view of the chassis member of the electronic apparatus.

FIG. 5 is a sectional side view of the chassis member 12A of the electronic apparatus 10. As illustrated in FIG. 5, the heat pipe 38 has a heat receiving surface 38a in contact with the CPU 34 to receive heat, two side surfaces 38b perpendicularly intersecting with the heat receiving surface 38a, and an opposed surface 38c opposite to the heat receiving surface 38a. The side surface 38b does not need to perpendicularly intersect with the heat receiving surface 38a, and may be a surface somewhat obliquely intersecting with the heat receiving surface 38a, for example. The side surface 38b does not need to be a planar surface, and may be a concave-convex surface, or a curved surface, for example. The heat receiving surface 38a is a top surface, and the opposed surface 38c is a bottom surface. The CPU 34 and the heat receiving surface 38a do not need to be in direct contact with each other if they are thermally connected to each other, and a heat conductive plate or grease for enhancing heat conductivity may be provided between them, for example.

The first plate member 44 is in contact with the side surfaces 38b of the heat pipe 38 by being press-fitted in and fixed to them. The second plate member 46 is in contact with the first plate member 44 by being press-fitted in and fixed to a side of the first plate member 44 opposite to the heat pipe 38. Thus, one side surface of the first plate member 44 is thermally connected to the side surface of the heat pipe 38, and the other side surface of the first plate member 44 is thermally connected to a side surface of the second plate member 46. In addition, the heat pipe 38 and the first plate member 44 have the same thickness, and the second plate member 46 is thinner than the first plate member 44, as described above.

With such a configuration, the heat generated by the CPU 34 is transferred from the heat pipe 38 to the first plate member 44 and the second plate member 46 to be diffused, as indicated by an arrow A.

A bottom surface 44a (connecting surface) of the first plate member 44 and a bottom surface 46a (connecting surface) of the second plate member 46 are formed coplanarly with the opposed surface 38c of the heat pipe 38. The bottom surface 44a of the first plate member 44, the bottom surface 46a of the second plate member 46, and the opposed surface 38c of the heat pipe 38 are each in opposed contact with the inner surface 12Aa of the chassis member 12A through the metallic film 52. The metallic film 52 and the inner surface 12Aa function as heat-transfer materials thermally connecting the heat pipe 38, the first plate member 44, and the second plate member 46. Such a heat-transfer material may be either one of the metallic film 52 or the chassis member 12A. When the chassis member 12A is used as a heat-transfer material, it may be made of metal. Such a heat-transfer material is in contact with the opposed surface 38c, the bottom surfaces 44a and 46a, of the heat pipe 38, the first plate member 44 and the second plate member 46, respectively, which surfaces are coplanar with one another, to promote the heat transfer among them. It is to be noted that, a form in which the heat-transfer material is in contact with the heat pipe 38, the first plate member 44, and the second plate member 46, may be any thermal connection, and another thin heat-transfer material, such as an adhesive or grease, may intervene between them.

With such a configuration, the heat generated by the CPU 34 is transferred from the heat pipe 38, the first plate member 44, and the second plate member 46 to the metallic film 52 and the chassis member 12A to be diffused as indicated by an arrow B, in addition to the pathway indicated by the arrow A.

The heat transport device 11 and the metallic film 52, or the heat transport device 11 and the chassis member 12A are entirely or partly adhered by a heat conductive adhesive (for example, graphite base compound, silicone-based adhesive). An adhesive having a moderate adhesion, which allows the heat transport device 11 to be removed from the chassis member 12A, is used in consideration of repairability.

The thus configured heat transport device 11 can be formed thin in the top and bottom direction since the heat pipe 38 is sandwiched between the CPU 34 and the chassis member 12A, and the heat spreader 40 does not overlap in this part.

In addition, the heat pipe 38 and the first plate member 44 have the same thickness to ensure a large area of contact to enhance heat conductivity. Since the first plate member 44 has an area equal to or larger than that of the heat pipe 38, it can receive heat from the heat pipe 38 to moderately radiate it.

Further, since the second plate member 46 engages with the first plate member 44 in the engaging portions 48, a large area of contact is ensured to enhance heat conductivity. The second plate member 46 is wider than the first plate member 44 to have high heat radiation performance. Although the second plate member 46 is wider than the first plate member 44, it is lighter in weight since it is formed thinner.

In addition, since the heat pipe 38, the first plate member 44, and the second plate member 46 have the respective bottom surfaces forming the same surface and are in contact with the chassis member 12A through the metallic film 52, heat conductivity among these three members is increased to make the heat easier to radiate.

It is to be noted that, although the first plate member 44 is provided at both the sides of the heat pipe 38 as illustrated in FIG. 5, it may be provided at only one side according to design conditions. Similarly, although the second plate member 46 is provided at both the sides of the heat pipe 38 across the first plate member 44, it may be provided at only one side according to design conditions.

Figure 6A:
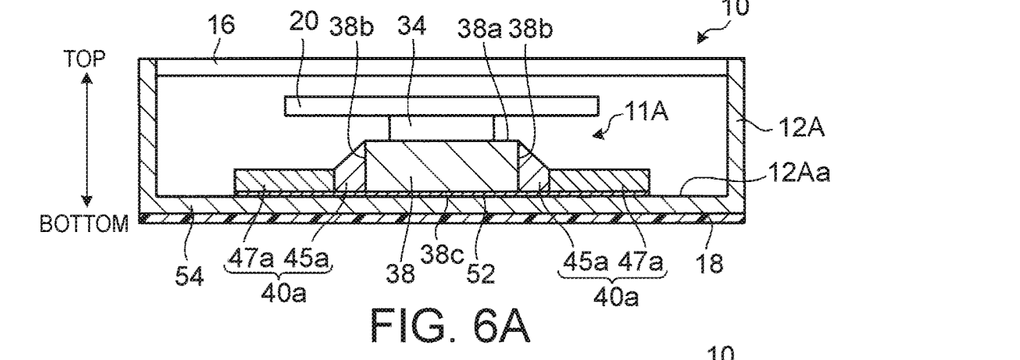
FIG. 6A is a sectional side view of a heat transport device according to the first modified example.
Figure 6B:
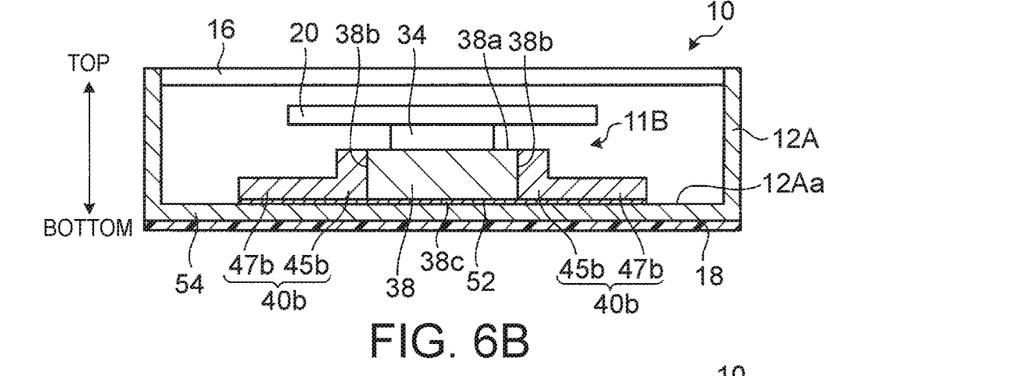
FIG. 6B is a sectional side view of a heat transport device according to the second modified example.
Figure 6C:
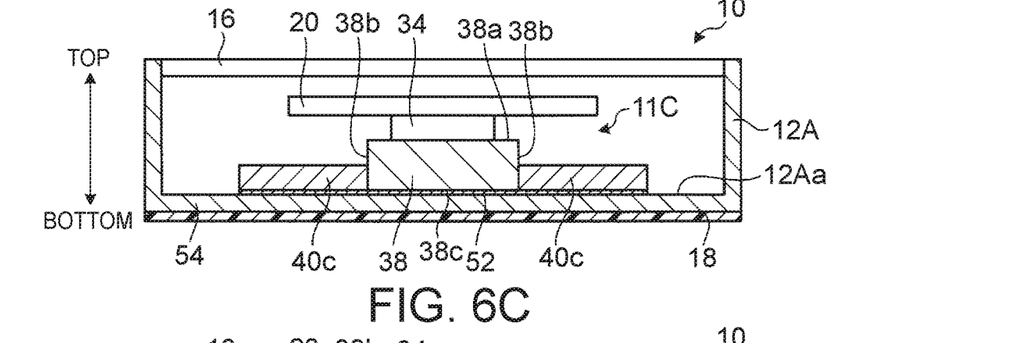
FIG. 6C is a sectional side view of a heat transport device according to the third modified example.
Figure 6D:
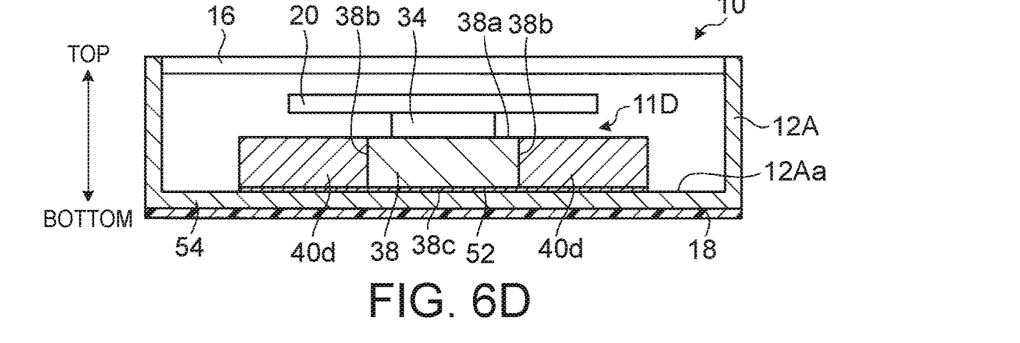
FIG. 6D is a sectional side view of a heat transport device according to the fourth modified example.

FIG. 6 is diagrams illustrating modified examples of the heat transport device 11, FIG. 6A is a sectional side view of the heat transport device 11A according to the first modified example, FIG. 6B is a sectional side view of the heat transport device 11B according to the second modified example, FIG. 6C is a sectional side view of the heat transport device 11C according to the third modified example, and FIG. 6D is a sectional side view of the heat transport device 11D according to the fourth modified example. In each modified example, the same components as those of the above-described heat transport device 11 are assigned by the same symbols and the detailed description thereof will be omitted.

As illustrated in FIG. 6A, the heat transport device 11A according to the first modified example includes the heat pipe 38 and a heat spreader 40a. The heat spreader 40a includes a first plate member 45a and a second plate member 47a. The second plate member 47a is the same as the above-described second plate member 46. The first plate member 45a has a side surface that is in contact with the side surface 38b of the heat pipe 38 and as moderately thick as the heat pipe 38, has another side surface that is in contact with the second plate member 47a and as moderately thin as the second plate member 47a, and has a top surface that is an inclined surface connecting these two side surfaces. Such a shape makes the first plate member 45a lighter in weight.

As illustrated in FIG. 6B, the heat transport device 11B according to the second modified example includes the heat pipe 38 and a heat spreader 40b. The heat spreader 40b includes a first plate member 45b and a second plate member 47b. The first plate member 45b has the same thickness and area as the above-described first plate member 44, and the second plate member 47b has the same thickness and area as the above-described second plate member 46. The first plate member 45b and the second plate member 47b are integral to have high heat conductivity. The heat spreader 40b is formed, for example, by scraping off a top part of the second plate member 47b from a base material having the same thickness as the first plate member 45b by machine processing (for example, Computerized Numerical Control), or it is obtained by integrating the first plate member 45b and the second plate member 47b, which are separate members, by welding. A top surface of the first plate member 45b may be an inclined surface like that of the first plate member 45a in FIG. 6A.

As illustrated in FIG. 6C, the heat transport device 11C according to the third modified example includes the heat pipe 38 and a heat spreader 40c. The heat spreader 40c is press-fitted in and fixed to the heat pipe 38, as is the case with the above-described first plate member 44. The heat spreader 40c has the same thickness as the above-described second plate member 46 and has a combined area of the first plate member 44 and the second plate member 46. That is, the heat spreader 40c has a shape that is not divided into, such as the above-described first plate member 44 and second plate member 46, and is moderately thin and light in weight. In this heat transport device 11C, an area of direct contact between the heat pipe 38 and the heat spreader 40c is a little small, however, heat-transfer performance is secured by indirect thermal contact through the metallic film 52 and/or the chassis member 12A.

As illustrated in FIG. 6D, the heat transport device 11D according to the fourth modified example includes the heat pipe 38 and a heat spreader 40d. The heat spreader 40d is press-fitted in and fixed to the heat pipe 38, as is the case with the above-described first plate member 44. The heat spreader 40d has the same thickness as the above-described first plate member 44 and has a combined area of the first plate member 44 and the second plate member 46. That is, the heat spreader 40d has a shape that is not divided into, such as the above-described first plate member 44 and second plate member 46. In this heat transport device 11D, a moderately large area of direct contact between the heat pipe 38 and the heat spreader 40d and indirect contact through the metallic film 52 and the chassis member 12A further improve heat-transfer performance. When aluminum is used, for example, the heat spreader 40d becomes light in weight compared to when a copper material is used.

Figure 7:
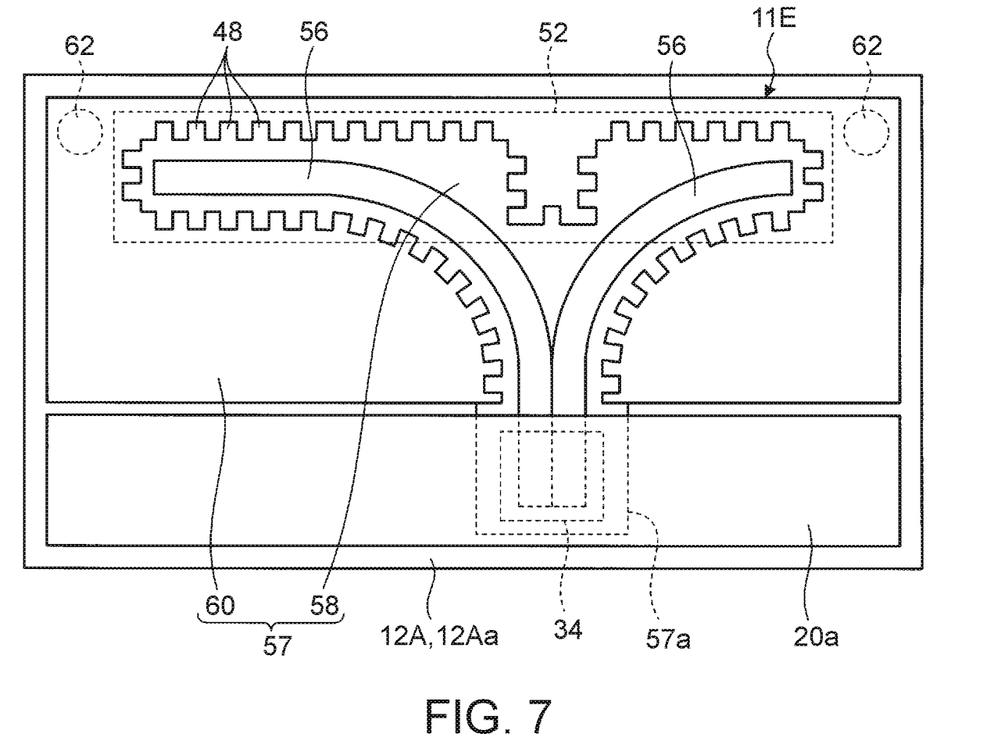
FIG. 7 is a plan view of a heat transport device according to the fifth modified example.

FIG. 7 is a plan view of the heat transport device 11E according to the fifth modified example. As illustrated in FIG. 7, the heat transport device 11E according to the fifth modified example includes two heat pipes 56, and a heat spreader 57. The heat spreader 57 includes a first plate member 58 and a second plate member 60. The heat pipe 56, the heat spreader 57, the first plate member 58, and the second plate member 60 are equivalent to the above-described heat pipe 38, heat spreader 40, first plate member 44, and second plate member 46, respectively.

The heat spreader 57 has a horizontally long rectangular shape and is partly provided with a protrusion 57a. The two heat pipes 56 have one ends disposed in the protrusion 57a, extend in a flattened Y-shape, and have other ends each extending to the vicinity of a corner part of the heat spreader 57. The first plate member 58 has a shape surrounding the whole of the protrusion 57a and the two heat pipes 56 extending in a Y-shape. The heat pipe 56 and the first plate member 58 have the same thickness and are press-fitted in and fixed to each other. The second plate member 60 forms a part of the heat spreader 57 other than the first plate member 58. The first plate member 58 and the second plate member 60 are press-fitted in and fixed to each other while engaging with each other in the engaging portions 48. The second plate member 60 is thinner and wider than the first plate member 58.

A main board 20a to be combined with the heat transport device 11E has an elongated shape and overlaps the protrusion 57a in planar view. The CPU 34 of the main board 20a is located in the protrusion 57a in planar view and is in contact with the heat pipes 56 to transfer heat. Thus, since another part of the main board 20a need not overlap the heat transport device 11E as long as the CPU 34 to be cooled is in contact with the heat pipe 56, a degree of freedom of layout increases.

In addition, an adhesive 62 that fixes the heat transport device 11E and the inner surface 12Aa of the chassis member 12A may be provided in a place away from the CPU 34 (the vicinity of an end part of the heat pipe 56 opposite to a connection end with the CPU 34) in the heat spreader 57. Thus, the heat generated by the CPU 34 is not directly transferred to the chassis member 12A, generation of a hot spot in the chassis member 12A can be prevented, and a feeling of strangeness is not given to a user.

Similarly, when the metallic film 52 to be provided on the inner surface 12Aa is provided in a position slightly away from the CPU 34 (an area along a side opposite to the side provided with the protrusion 57a and including many of the engaging portions 48), the generation of a hot spot in the chassis member 12A can be prevented. Further, if the cover 18 (refer to FIG. 5) is made of a heat-insulating material, such as polyurethane, a feeling of strangeness given to a user by a hot spot can be further reduced.

As has been described, the present invention provides an improved heat transport device that transports heat of a heating element within an electronic apparatus.

While the invention has been particularly shown and described with reference to a preferred embodiment, it will be understood by those skilled in the art that various changes in form and detail may be made therein without departing from the spirit and scope of the invention.

What is claimed is:

1. A heat transport device, comprising: a heat pipe thermally connecting to a heating element, wherein said heat pipe includes a heat-receiving top surface directly contacting said heating element to receive heat from said heating element; and a side surface orthogonal to said heat-receiving top surface; and a heat spreader thermally connecting to said heat pipe to dissipate heat, wherein said heat spreader includes a first plate member having a first-plate side surface directly contacting said side surface of said heat pipe, and a first plate top surface orthogonal to said first-plate side surface, said first-plate top surface does not contact said heating element and said heat pipe; and a second plate member having a second-plate side surface directly contacting said first-plate side surface of said first plate member, and a second plate top surface orthogonal to said second-plate side surface, said second-plate top surface does not contact said heating element and said heat pipe; and a heat-transfer material in opposed contact with a connecting surface of said first plate member, a connecting surface of said second plate member, and an opposed surface of said heat pipe.

2. The heat transport device of claim 1, wherein said second plate member is thinner than said first plate member.

3. The heat transport device of claim 1, wherein said heat-transfer material is a chassis of an electronic apparatus for which said heat transport device is provided.

4. The heat transport device of claim 1, wherein said heat-transfer material is a metallic film provided on an inner surface of a chassis of an electronic apparatus for which said heat transport device is provided.

5. The heat transport device of claim 1, wherein said first-plate side surface and said second-plate side surface are comb-teeth like surfaces, such that the contacting boundary of said first-plate side surface and said second-plate side surface is zig-zag like.

6. The heat transport device of claim 1, wherein said first-plate top surface is flushed with said heat-receiving top surface of said heat pipe.

7. An electronic apparatus comprising: a heating element; a heat transport device for transporting heat from said heating element, wherein said heat transport device includes a heat pipe thermally connecting to said heating element, wherein said heat pipe includes a heat-receiving top surface directly contacting said heating element to receive heat from said heating element; and a side surface orthogonal to said heat-receiving top surface; a heat spreader thermally connecting to said heat pipe to radiate heat, wherein said heat spreader includes a first plate member having a first-plate side surface directly contacting said side surface of said heat pipe, and a first plate top surface orthogonal to said first-plate side surface, said first-plate top surface does not contact said heating element and said heat pipe; and a second plate member having a second-plate side surface directly contacting said first-plate side surface of said first plate member, and a second plate top surface orthogonal to said second-plate side surface, said second-plate top surface does not contact said heating element and said heat pipe; a heat-transfer material in opposed contact with a connecting surface of said first plate member, a connecting surface of said second plate member, and an opposed surface of said heat pipe; and a chassis in opposed contact with said heat-transfer material.

8. The electronic apparatus of claim 7, wherein said second plate member is thinner than said first plate member.

9. The electronic apparatus of claim 7, wherein said heat-transfer material is a metallic film provided on an inner surface of said chassis.

10. The electronic apparatus of claim 7, wherein said first-plate side surface and said second-plate side surface are comb-teeth like surfaces, such that the contacting boundary of said first-plate side surface and said second-plate side surface is zig-zag like.

11. The electronic apparatus of claim 7, wherein said first-plate top surface is flushed with said heat-receiving top surface of said heat pipe.

\* \* \* \* \*